(12) United States Patent
Gotoh et al.

(10) Patent No.: US 6,320,739 B1
(45) Date of Patent: Nov. 20, 2001

(54) ELECTRONIC PART AND MANUFACTURING METHOD THEREFOR

(75) Inventors: Masashi Gotoh; Jitsuo Kanazawa; Syuichiro Yamamoto, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/292,735

(22) Filed: Apr. 16, 1999

(30) Foreign Application Priority Data

Apr. 18, 1998 (JP) .................................................. 10-124184

(51) Int. Cl.$^7$ ....................................................... H05K 1/18
(52) U.S. Cl. ........................... 361/386; 361/401; 361/404
(58) Field of Search .................................. 361/401, 386, 361/81, 404, 414; 29/845, 830, 843; 428/209, 461, 901; 357/72, 80, 84, 74; 425/117; 228/121; 257/151–155

(56) References Cited

U.S. PATENT DOCUMENTS

| | | | |
|---|---|---|---|
| 3,883,946 | * 5/1975 | Dale | 228/121 |
| 4,630,172 | * 12/1986 | Stenerson et al. | 361/386 |
| 4,644,643 | * 2/1987 | Sudo | 29/845 |
| 4,671,984 | * 6/1987 | Maeda et al. | 428/209 |
| 4,680,613 | * 7/1987 | Daniels et al. | 357/72 |
| 4,680,617 | * 7/1987 | Ross | 357/72 |
| 4,872,825 | * 10/1989 | Ross | 425/117 |
| 4,965,702 | * 10/1990 | Lott et al. | 361/401 |

FOREIGN PATENT DOCUMENTS

| | | |
|---|---|---|
| 2-179018 | 7/1990 | (JP) . |
| 5-160574 | 6/1993 | (JP) . |
| 8-148602 | 6/1996 | (JP) . |
| 8-181243 | 7/1996 | (JP) . |
| 10-163647 | 6/1998 | (JP) . |

* cited by examiner

*Primary Examiner*—Charles Bowers
*Assistant Examiner*—Laura M Schillinger
(74) *Attorney, Agent, or Firm*—Oblon, Spivak, McClelland, Maier & Neustadt, P.C.

(57) ABSTRACT

An electronic part in which a chip 2 having bump electrodes is sealed in a cavity 14 of a resin container 10, wherein the resin container having: a mounting board 1 having a conductor pattern 4 for bump-mounting the chip 2; an intermediate board 5 overlaid on the mounting board 1 and having a window for forming an inner wall apart from the chip 2 for predetermined distances; a cover board overlaid on the intermediate board 5 to cover the window; a first adhesive layer 8 which is interposed between overlaid portions of the mounting board 1 and the intermediate board 5; and a second adhesive layer 9 which is interposed between overlaid portion of the intermediate board 5 and the cover board 7, wherein the first and second adhesive layers 8 and 9 between which the intermediate board 5 is interposed are heated and pressed at a time in a direction of the thickness of each of the mounting board 1 and the cover board 7, and the mounting board 1, the intermediate board 5 and the cover board 7 are brought into intimate contact with one another so as to seal and form the cavity 14 defined by the inner wall of the window.

2 Claims, 5 Drawing Sheets

ELECTRONIC PART AND MANUFACTURING METHOD THEREFOR

BACKGROUND OF THE INVENTION

The present invention relates to an electronic part constituted by sealing a chip device in a cavity of a resin container and a manufacturing method therefor.

In recent years, size reduction and improvement in the performance of a variety of electronic apparatuses, such as portable telephones and personal computers, have proceeded. Therefore, size reduction, improvement in the reliability, cost reduction and so forth of the electronic part are required to be flexibly adaptable to dense mounting, such as chip-on-board mounting with which a multiplicity of bare chip devices (bare chips) are directly mounted on a printed circuit board.

In addition to the conventional resistors, capacitors, coils and semiconductor devices, the electronic parts for use in the electronic apparatus have been varied which include, for example, electro-optic devices and surface-acoustic-wave devices, which incorporate mechanically weak materials, such as the ferroelectric piezoelectric single-crystal substrates. In the foregoing circumstance in which the electronic parts have been varied, optimum mounting must be performed to protect the surface of the electronic part while considering adaptation to common use and standardization. Since the materials for use in the electronic parts have been varied recently, the conventional rough method of directly covering the surface of a passive device or a transistor, with a silicon resin or an epoxy resin cannot realize satisfactory reliability because resistance against thermal stress and mechanical impact is unsatisfactory.

Therefore, the electronic parts including the electro-optical devices or the surface-acoustic-wave devices which use mechanically weak materials, have been mounted by a method of, for example, forming a cavity in a resin container and mounting a chip in the cavity.

FIGS. 6A and 6B are perspective views showing the structure of a conventional electronic part which is a surface-acoustic-wave device taken as an example. Initially, a chip device 32 is mounted on a resin board 31. Then, an adhesive agent is applied to the peripheral portion of the upper surface of the resin board 31 or an adhesive sheet layer is interposed. Then, a frame 33 is overlaid around the chip device 32 such that accurate locating is performed. Then, while pressure is being applied, a first heating and bonding process is performed to bond the frame 33 to the resin board 31 (see FIG. 6A). Then, while close attention is being paid to prevent discharge of the adhesive agent from the top end of the frame 33 and omission from the application of the adhesive agent, an adhesive agent or the like is applied to the upper surface of the frame 33, the cover 34 is mounted on the frame 33, and then a second heating and bonding process is performed such that pressure is again applied (see FIG. 6B). As described above, the bonding process is performed such that the application of the pressure and heat are performed two times. Then, a resin container 30 having a cavity 35 in which the chip device 32 is accommodated is formed. Thus, the electronic part has been manufactured.

The reason why the flat resin boards are superimposed to form a multilayer structure similar to a sandwich is that the manufacturing cost must be reduced. Examples of the foregoing structure have been disclosed also in Japanese Patent Laid-Open No. 2-179018. With the conventional technique, the chip device 32 is mounted on the resinboard 31, and then the frame 33 is bonded. Another example is structured such that the frame 33 is bonded to the upper surface of the resin board 31 to form a recess on which the chip device 32 is mounted.

However, the above-mentioned conventional technique is required to accurately locate the bonding positions whenever the resin board is overlaid. When the size of the electronic part is furthermore reduced, the relative positions among the boards and the positions of the adhesive agents and the adhesive layers must accurately be located whenever the board is overlaid. Thus, there arises a problem in that satisfactory productivity cannot be realized and the operation cost cannot be reduced.

In general, plastic deformation of the resin board easily occurs when the resin board is heated or pressed. When the adhesive process for heating the resin board while applying pressure to the resin board is performed repeatedly, the amounts of deformation is accumulated excessively to perform accurate locating. What is worse, the sealing characteristic deteriorates, leak easily takes place and the reliability deteriorates. When the process for bonding the resin boards to each other is performed by using a prepreg or an adhesive resin, the bonded prepreg or the adhesive resin is softened or deformed if the pressure and heat are applied afterwards. Therefore, there arises a problem in that the resin components seep and the resin container is deformed and distorted. Another problem arises in that a portion of the resin component is gasified and the inside portion of the resin container is filled with the gas. In this case, the gasified resin adheres to the surface of the chip device. Thus, the chip device is contaminated.

SUMMARY OF THE INVENTION

An object of the present invention is to provide an electronic part which is capable of solving the above-mentioned problems, which permits size and cost reduction to easily be performed and which improves the reliability and a manufacturing method therefor.

To achieve the above-mentioned object, an electronic part according to the present invention in which a chip device having bump electrodes is sealed in a cavity of a resin container, wherein the resin container includes: a mounting board having a conductor pattern formed on at least either surface of a resin member for the purpose of bump-mounting the chip device; an intermediate board constituted by a frame-shape resin member, which is overlaid on the mounting board, which has a window for forming an inner wall apart from the chip device for predetermined distances and which is made of a frame-shape resin member; a cover board constituted by a resin member overlaid on the intermediate board to cover the window; a first adhesive layer which is interposed between overlaid portions of the mounting board and the intermediate board; and a second adhesive layer which is interposed between overlaid portion of the intermediate board and the cover board, wherein the first and second adhesive layers between which the intermediate board is interposed are heated and pressed at a time in a direction of the thickness of each of the mounting board and the cover board; and the mounting board, the intermediate board and the cover board are brought into intimate contact with one another so as to seal and form the cavity defined by the inner wall of the window.

According to the present invention, the mounting board and the cover board are located and applied with pressure and heat from outside only one time. Thus, the first adhesive layer and the second adhesive layer bond the mounting board, the intermediate board and the cover board by one-time adhesive process so as to seal and form the cavity in the resin container.

According to the present invention, there is provided a method of manufacturing an electronic part incorporating a chip device which is provided with bump electrodes and which is sealed in a cavity of a resin container, the method of manufacturing an electronic part comprising: a first step for bump-mounting the chip device on a conductor pattern of a mounting board provided with the conductor pattern for at least either surface of a resin member; a second step for overlaying an intermediate board which incorporates a frame-shape resin member having a window formed apart from the chip device for predetermined distances on the mounting board such that the first adhesive layer is interposed; a third step for overlaying a cover board constituted by a resin member for covering the window on the intermediate board such that a second adhesive layer is interposed: and a fourth step for, at a time, applying pressure and heating the mounting board and the cover board having the intermediate board interposed therebetween from outside in a direction of the thickness of each of the mounting board and the cover board to bring the mounting board, the intermediate board and the cover board into intimate contact with each other so as to seal and form the inner cavity defined by the inner wall of the window.

The method according to the present invention facilitates the process for locating the chip device which must be mounted and a face-down bonding process in the first step because any bonded obstruction, such as a board, does not exist on the mounting board. In the second and third steps, the mounting board, the intermediate board, the cover board and the first and second adhesive layers which are interposed among the foregoing boards are not secured to one another. Therefore, accurate mutual locating and position adjustment can easily be performed. In the fourth step, heat history and stress of the resin and the chip device can be minimized.

It is preferable that the process for applying the pressure in the direction of the thickness of each of the mounting board and the cover board such that the intermediate board is interposed is performed such that the pressure is not applied to a region in which the window has been provided. Specifically, the process for applying the pressure in the direction of the thickness of each of the mounting board and the cover board such that the intermediate board is interposed can be performed by using a pressing plate having frames corresponding to frame portions of the intermediate board.

EMBODIMENT OF THE INVENTION

An embodiment of an electronic part and a manufacturing method therefor according to the present invention will now be described with reference to the drawings.

Figure 1:
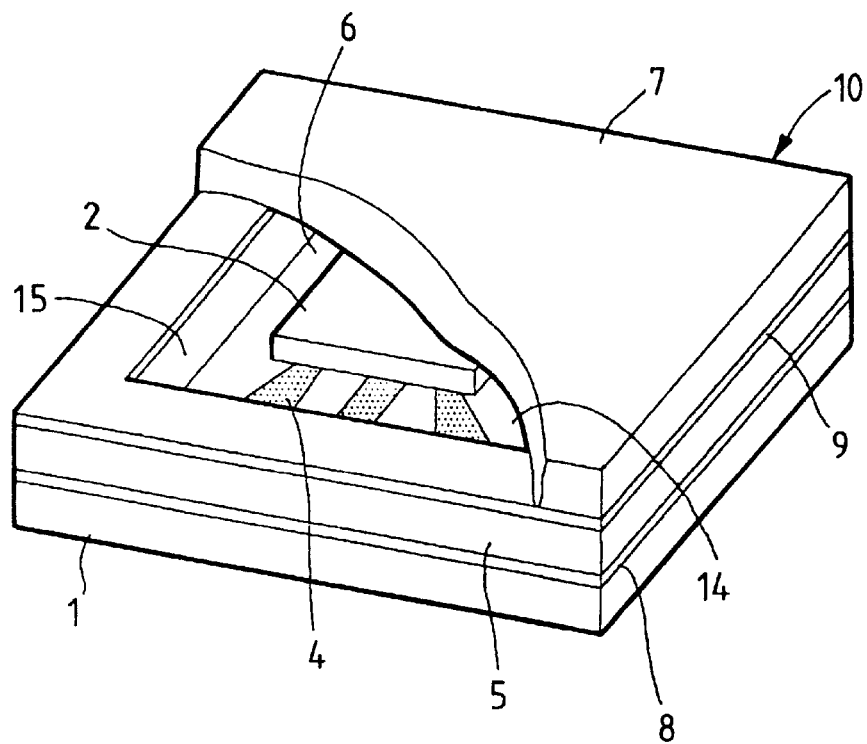
FIG. 1 is a perspective view from which a portion has been cut and which shows an embodiment of an electronic part according to the present invention and a manufacturing method therefor.
Figure 2:
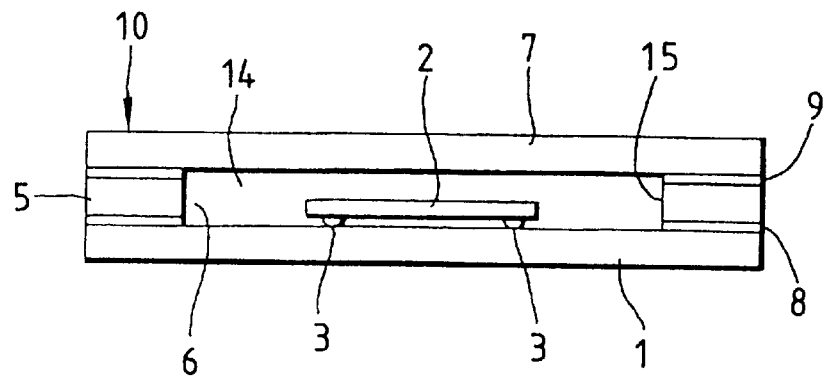
FIG. 2 is a front cross sectional view.
Figure 3:
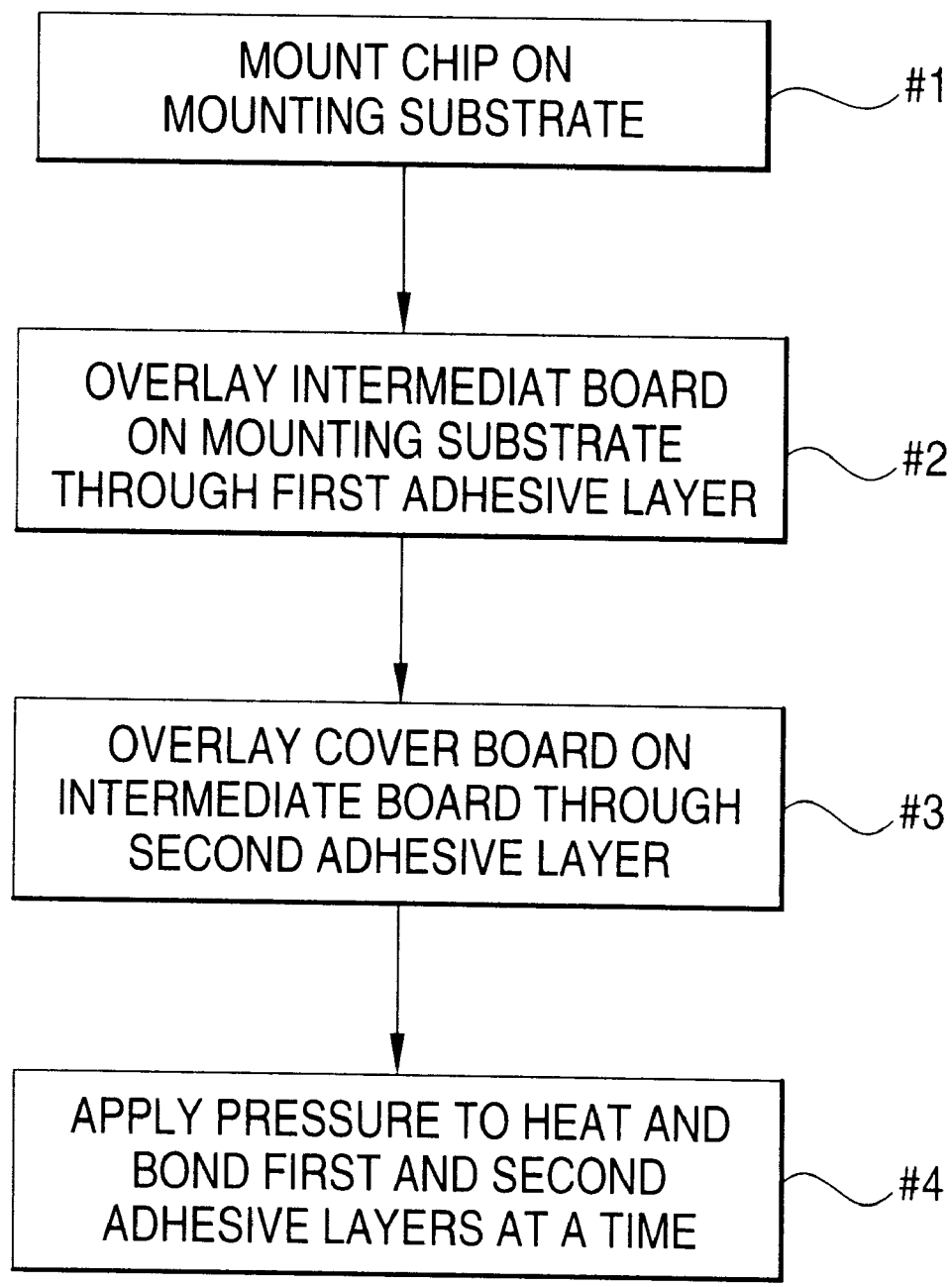
FIG. 3 is a flow chart of a manufacturing process according to the embodiment of the present invention.
Figure 4:
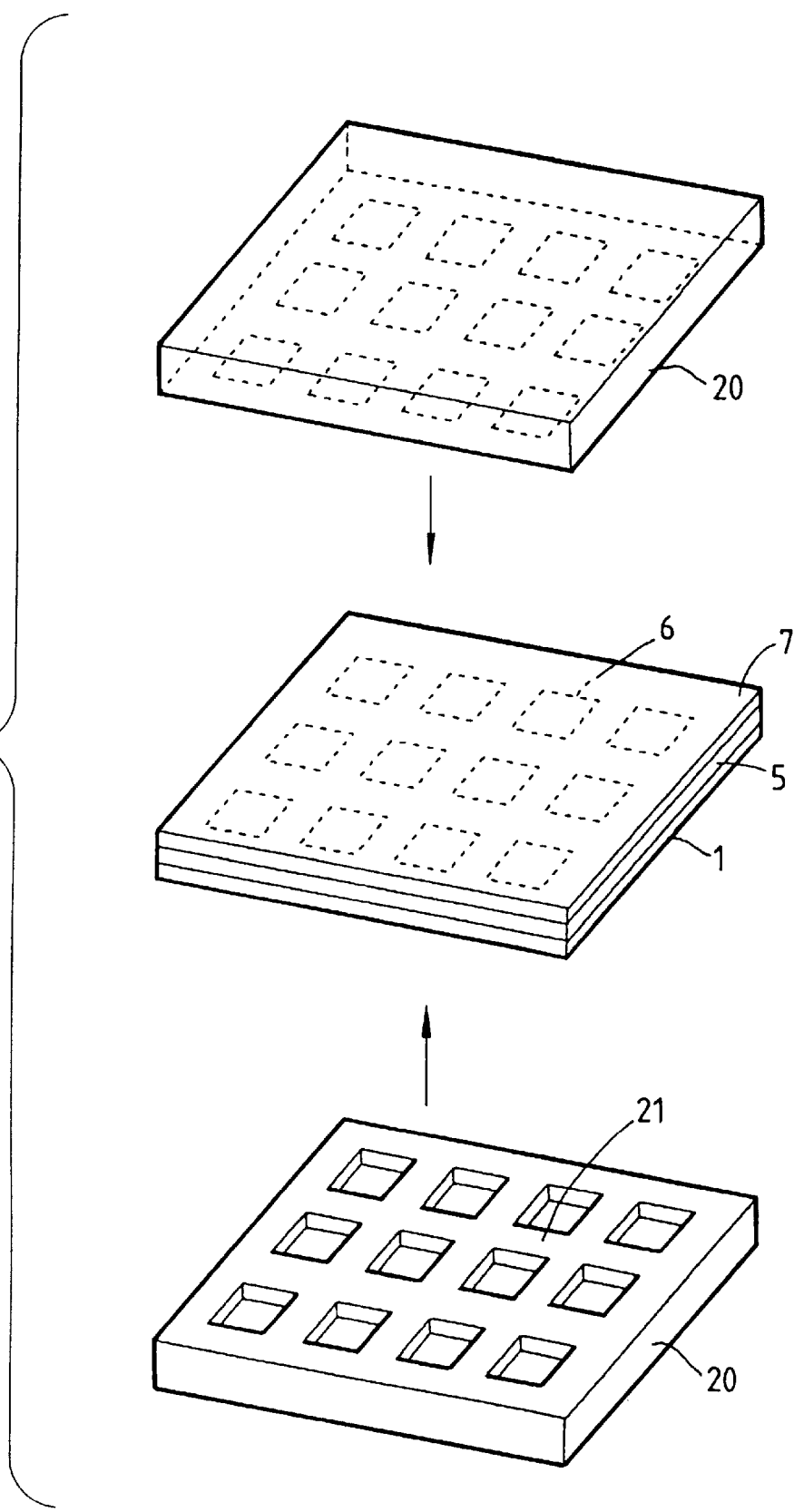
FIG. 4 is a perspective view showing examples of jigs (pressing plates) for use in the manufacturing process.

Referring to FIGS. 1 to 4, the electronic part and the manufacturing method therefor according to the present invention will now be described. FIG. 1 is a perspective view showing the structure of the electronic part which is a surface-acoustic-wave device taken as an example. FIG. 2 is a cross sectional view showing the foregoing structure. FIG. 3 is a diagram showing a manufacturing process. FIG. 4 is a perspective view showing a pressing plate for use in the manufacturing process. In the following description with reference to FIGS. 1 and 2, the structure of one electronic part is illustrated. In the intermediate process, electronic parts in an aggregation state continued in the lateral direction is manufactured. Finally, a cutting and separating process is performed so that one electronic part is manufactured.

Referring to FIGS. 1 and 2, a conductor pattern 4, on which a surface-acoustic-wave device chip (a SAW) 2 serving as the chip device is mounted by a face-down bonding method through bumps 3 is provided for either surface of a mounting substrate 1 made of an epoxy resin or a BT resin. The conductor pattern 4 is in the form of copper foil pattern partially or fully covered with solder, nickel or gold plating. An intermediate board 5 is overlaid on the mounting substrate 1. The intermediate board 5 has a window 6 for forming an inner wall 15 positioned a part from the chip 2 for predetermined distances. A cover board 7 is formed to cover the window 6 of the intermediate board 5. The boards 1, 5 and 7 are bonded to one another by the following adhesive layers so that a resin container 10 is formed. The resin container 10 has a cavity 14 for accommodating the surface-acoustic-wave chip 2.

It is preferable that the mounting substrate 1, the intermediate board 5 and the cover board 7 are made of resin materials substantially having the same thermal expansion coefficients and constituted by the same resin boards. A first adhesive layer 8 is interposed between the mounting substrate 1 and the intermediate board 5. A second adhesive layer 9 is interposed between the intermediate board 5 and the cover board 7. The first adhesive layer 8 and the second adhesive layer 9 are, at a time, heated and pressed in a direction of the thickness of each of the mounting substrate 1 and the cover board 7 such that the intermediate board 5 is interposed between the first adhesive layer 8 and the second adhesive layer 9. It is preferable that the first adhesive layer 8 and the second adhesive layer 9 are basically made of the same material as that of the mounting substrate 1, the intermediate board 5 and the cover board 7. Moreover, it is preferable that the mate rial is selected from adhesive resins having satisfactory adhesiveness with respect to the mounting substrate 1, the intermediate board 5 and the cover board 7.

It is preferable that the surfaces of the boards 1, 5 and 7 to which the adhesive layers 8 and 9 are bonded are resin surfaces of resin materials which are not covered with a conductor or the like, that is, the resin surfaces are exposed. In particular, each of the surfaces of the intermediate board 5 and the cover board 7 which must be bonded is not covered with a conductor pattern, that is, the resin surfaces are exposed to the outside. The two boards are bonded to each other by the adhesive layer. The foregoing fact is required to completely seal the cavity with the resin.

If the adhesive layers are bonded to the surface of the conductor pattern 4 and thus the adhesive layer are laminated, the surface of the copper foil for forming the copper foil pattern and the upper surface of the copper or nickel plating may be roughened. Thus, the adhesive layer is able to easily exhibit an anchoring effect for the roughened interface of the bonded surfaces. Thus, the strength of adhesive bonding can be improved. In the foregoing case, in place of the method of bonding the adhesive layer to the exposed resin surface which is not covered with the conductor pattern, a method of bonding the adhesive layer to the surface of the conductor pattern sometimes enables strong bonding to be performed depending on the roughening method and the shape of the roughened surface.

The manufacturing method according to the present invention will now be described with reference to FIGS. 3 and 4. FIG. 3 is a flow chart showing a process for manufacturing the electronic part shown in FIGS. 1 and 2. In first step #1, the surface-acoustic-wave device chip 2 which is the chip device is bump-mounted on the conductor pattern 4 on either surface of the mounting substrate 1. In second step #2, the intermediate board 5 is overlaid on the mounting substrate 1 such that the first adhesive layer 8 is interposed. In third step #3, the cover board 7 for covering the window 6 is overlaid on the intermediate board 5 such that the second adhesive layer 9 is interposed. In fourth step #4, pressure is applied from the direction of the thickness of each of the mounting substrate 1 and cover board 7 between which the intermediate board 5 is interposed and heated at a time. Bonding of the intermediate board 5 and the intermediate board 5 and that of the intermediate board 5 and the cover board 7 using the adhesive layers are simultaneously performed. Thus, the cavity is sealed and formed in the resin container.

FIG. 4 is a perspective view showing the structure of pressing plates 20 for heating the mounting substrate 1, the intermediate board 5 and the cover board 7 (each of which is in a state of an aggregation which has not been separated from one another) while pressure is being applied in the direction of the thickness so as to bond the resin container in fourth step #4. The operation for pressing the mounting substrate 1 and the cover board 7 between which the intermediate board 5 is interposed in the direction of the thickness is performed by using the pressing plates 20 each having frames 21 projecting over the surface thereof and corresponding to the frame portions of the intermediate board 5 except for the window 6. Thus, when the mounting substrate 1, the intermediate board 5 and the cover board 7 are laminated and bonded by using the adhesive layers, excess pressure is not applied to the window portion of the intermediate board 5. That is, no pressure is applied to the bump mounting region of the chip 2 in the cavity and its surrounding portion in the cavity. As a result, a problem that the bumps 3 secured and mounted on the mounting substrate 1 are separated by the pressure applied during the bonding process can be prevented.

Although the upper and lower pressing plates 20 are employed in the structure shown in FIG. 4, use of either pressing plate 20 is permitted. In FIG. 4, the pressing plates 20 for bonding the resin container are formed into plate structures which have asperities on the surface thereof and which are provided with the frames. The pressing plates 20 are not limited to the foregoing structures. Plates simply having holes may be employed. As an alternative to this, plates obtained by providing somewhat curved surfaces for the overall body thereof may be employed with which optimum pressing can be performed.

The pressing plates are used to prevent application of excess pressure to the region (bump-mounting region of the chip and its surround portion) of the intermediate board 5 provided with the window so as to prevent deformation of the mounting substrate. If a means is able to prevent application of excess pressure to the region in which the window is formed, the pressing plates are not required to be made directly contact with the mounting substrate 1 and the cover board 7. If the adhesive agent seeps and thus the pressing plate and the adhesive agent are undesirably bonded to each other, a separating film may, of course, be inserted. To uniform the pressures of the pressing plates, a paper cushion may be inserted. That is, any means may be employed if the material or the structure is not employed with which the material interposed between the mounting substrate 1 and the cover board 7 does not apply excess pressure to the window portion because the material is deformed by heat and pressure.

Figure 5:
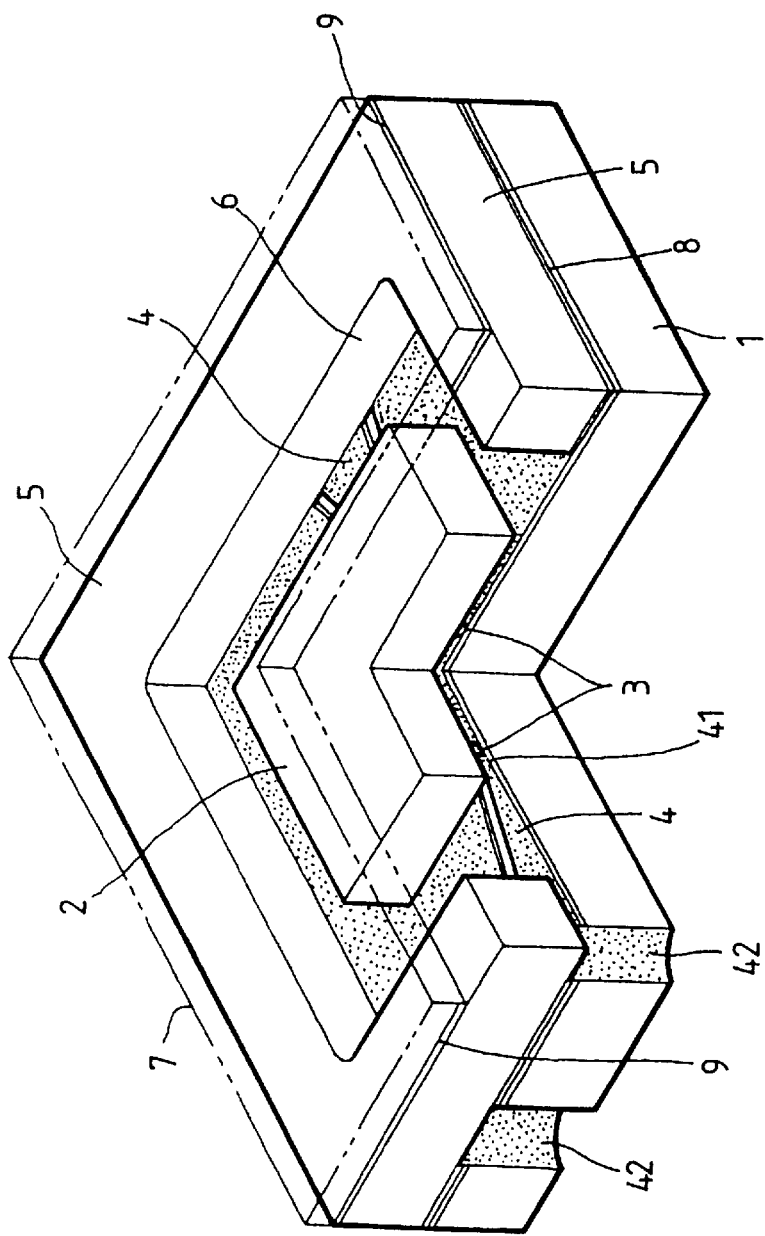
FIG. 5 is a perspective view from which a portion has been cut and which shows the structure of an example of the present invention.
Figure 6A:
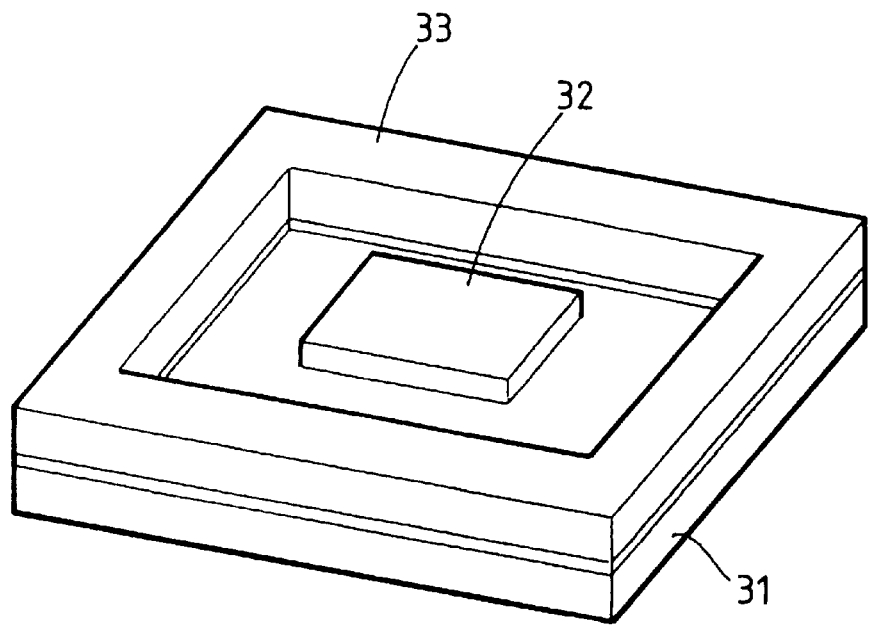
FIGS. 6A and 6B is a perspective view showing the structure of a conventional electronic part.
Figure 6B:
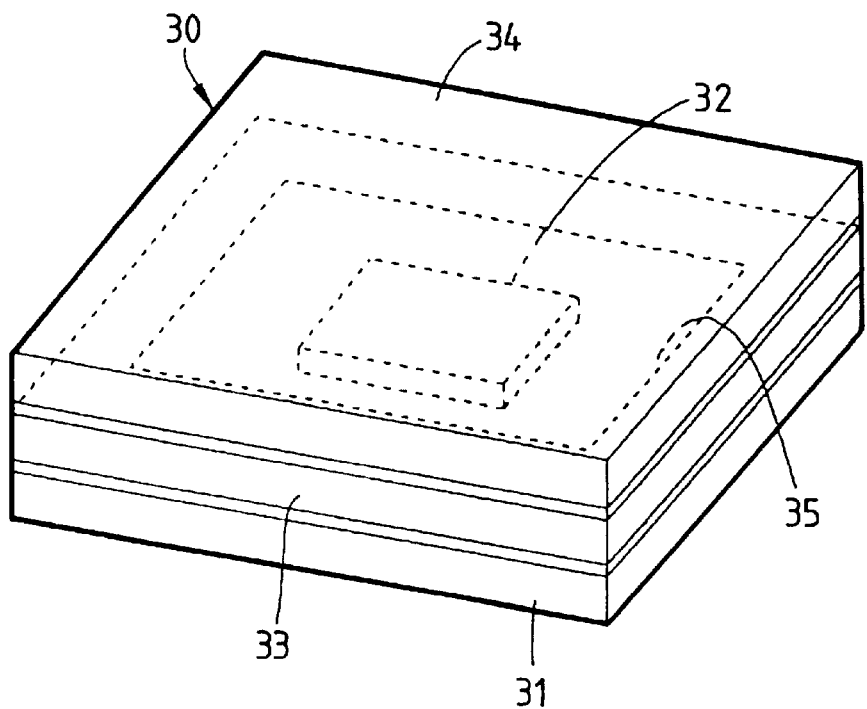

The electronic part according to the present invention will now be described by using an example shown in FIG. 5. The mounting substrate 1 according to this example was used as a substrate on which a SAW chip 2 which was the chip device was face-down-mounted. That is, a pad 41 was formed in a portion of the conductor pattern 4 on the mounting substrate 1 by a plated layer. The chip 2 was mounted on the pad 41. The intermediate board 5 was bonded to the mounting substrate 1 by a prepreg 8 which was a first adhesive layer. Moreover, the cover board 7 was bonded to the intermediate board 5 by prepreg 9 which was a second adhesive layer such that the chip 2 was covered. The chip 2 was sealed in the cavity formed as the internal space in the resin container. Note that an electrode 42 for external connection connected to the conductor pattern 4 was disposed on, for example, the side surface of the mounting substrate 1.

The mounting substrate 1, the intermediate board 5 and the cover board 7 were made of a resin which was a BT resin (CCL-HL830) manufactured by Mitsubishi Gas Chemical Industries Ltd. The conductor pattern 4 in the form of copper foil having a thickness of 18 μm was laminated on the upper surface of the mounting substrate 1. The plated layer for forming the pad 41 was a multilayer-plated structure constituted by sequentially laminating a copper plated layer having a thickness of 10 μm, a nickel plated layer having a thickness of 5 μm and a gold-plated layer having a thickness of 1 μm. Bumps 3 each having a diameter of 100 μm and made of gold were joined to the reverse side of the chip 2. The bumps 3 were used to face-down-bond the chip 2 to the upper surface of the pad 41 by supersonic bonding.

The resin was exposed to the upper end surface of the intermediate board 5 having the window 6. The cover board 7 made of a BT resin (CCL-HL830 manufactured by Mitsubishi Gas Chemical Industries Ltd.) having a thickness of 0.2 mm was bonded by the prepreg 9. The cover board 7 was a plate-like resin board having a reverse surface on which the resin was exposed to improve the adhesiveness with the prepreg 9. Note that a conductor layer may be provided for the upper surface of the cover board 7 to realize a shielding effect.

The prepregs 8 and 9 were GHPL-830NF which was a BT resin having characteristics similar to the foregoing resin, having a thickness of 60 μm and manufactured by Mitsubishi Gas Chemical Industries Ltd. The prepreg, the mounting substrate 1, the intermediate board 5 and the cover board 7 which were bonded to one another were hardened by applying heat at 200° C. for 2 hours in reduced pressure of about 20 Torr while a pressure of 30 kg/cm2 was being applied. Thus, spread of components leaked from the prepregs and having fluidity was limited to a range of about 300 μm.

Since the SAW chip uses the surface-acoustic-wave characteristics of the piezoelectric material, the device characteristics excessively deteriorate if the discharged prepreg or the like comes in contact with the SAW chip. The embodiment of the present invention is able to simultaneously bond the resin substrate, the intermediate board and the cover board by one time of application of pressure and heat to form the resin container including the cavity. When the chip is mounted after the mounting substrate and the intermediate board have been bonded, a great clearance which is determined in consideration of an amount of discharge of the prepreg must be provided as compared with the embodiment of the present invention. Therefore, the size of the electronic part cannot be reduced. From the above-mentioned viewpoint, the present invention is advantageous to reduce the size.

The present invention is characterized in that the mounting substrate, the intermediate board and the cover board are simultaneously bonded to one another by one bonding process. As compared with the individual bonding processes (that is, bonding of the cover board and the intermediate board or that of the intermediate board and the mounting substrate are sequentially and individually performed), an excellent effect can be obtained. That is, the problem can be prevented which arises in that gas produced when the bonded members are hardened is allowed to adhere to the surface of the intermediate board and, thus, contamination takes place and the adhesiveness deteriorates.

When bonding is performed by using heat, expanded air in the cavity can simultaneously be relieved through the vertically abutted surfaces of the laminated boards. Therefore, satisfactory air tightness can be realized as compared with a method with which individual bonding of the cover board and the intermediate board or that of the intermediate board and the mounting substrate is performed, followed by performing final bonding to closely seal the cavity.

Moreover, heat history to which the semiconductor device, the piezoelectric material, ion crystal substrate and so forth which are sensitive to thermal shock must be subjected can be limited to one time of heating and cooling. Therefore, an adverse influence which is exerted on the devices, the joint portions and the resin substrate can be prevented. When the piezoelectric device is employed, a significant effect can be obtained in that an unexpected problem, such as electrostatic fracture caused form pyroelectricity, can be prevented.

Although the foregoing embodiment has the structure that the mounting substrate is placed in the bottom of the resin container and the cover board is disposed in the upper portion, the present invention is not limited to this. The cover board may, of course, be placed in the bottom. The electrode for the external connection may be provided for any outer surface of the resin container constituted in the laminating and bonding step, the outer surfaces including the end surface.

Although the BT resin is employed as the resin according to the foregoing embodiment , as a matter of course, the technical concept of the present invention is not limited to this. Moreover, the mounting substrate, the intermediate board and the cover board may be made of different resins. For example, a light transmissive resin may partially be employed to introduce an optical signal from outside of the container into the cavity. Moreover, an arbitrary resin may be selected for each of the boards so as to optimize or adjust the thermal expansion coefficients.

Although the invention has been described in its preferred form and structure, it is understood for a skilled person in the industry that the present disclosure of the preferred form can be changed in the details of construction and in the combination and arrangement of parts without departing from the spirit and the scope of the invention.

As described above, the present invention has the structure that the resin container for accommodating a chip device in a cavity thereof is constituted by bonding three stacked resin boards by one time of heating and pressing. Therefore, an effect can be obtained in that the electronic part can be provided, the size and cost of which can be reduced and which exhibits satisfactory reliability.

What is claimed is:

1. A method of manufacturing an electronic part in which a chip device having bump electrodes is sealed in an inner cavity of a resin container, said method comprising:

bump-mounting said chip device on a conductor pattern of a mounting board which is made of a resin member, the conductor pattern being provided on at least either surface of the mounting board;

overlaying an intermediate board on said mounting board interposing a first adhesive layer between the mounting board and the intermediate board, the intermediate board comprising a frame shape resin member having a window, the chip device being positioned in the window;

overlaying a cover board constituted by a resin member for covering said window on said intermediate board such that a second adhesive layer is interposed between the intermediate board and the cover board; and applying pressure and heat to said mounting board, said cover board and said intermediate board interposed therebetween from outside in a direction of a thickness of each of said mounting board and said cover board to connect the mounting board, said intermediate board and said cover board with one another at one time so as to seal and form the inner cavity defined by an inner wall of said window, the pressure being applied in such a way so as to not pressurize a region in which the window has been provided.

2. A method of manufacturing an electronic part according to claim 1, wherein the process for applying the pressure in the direction of the thickness of each of said mounting board and said cover board such that said intermediate board is interposed is performed by using a pressing plate having frames corresponding to frame portions of said intermediate board.

* * * * *